United States Patent
Liu

(10) Patent No.: US 6,827,136 B2
(45) Date of Patent: Dec. 7, 2004

(54) HEAT DISSIPATING APPARATUS AND METHOD FOR PRODUCING SAME

(75) Inventor: HeBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 33 days.

(21) Appl. No.: 10/318,591

(22) Filed: Dec. 13, 2002

(65) Prior Publication Data

US 2004/0074633 A1 Apr. 22, 2004

(30) Foreign Application Priority Data

Oct. 18, 2002 (TW) ........................................ 91124029 A

(51) Int. Cl.[7] ................................................ F28F 7/00
(52) U.S. Cl. ................................ 165/104.33; 165/80.3; 165/185; 361/700; 257/715
(58) Field of Search .................... 165/80.3, 104.21, 165/104.33, 185; 361/700; 257/714, 715; 174/15.2, 16.3

(56) References Cited

U.S. PATENT DOCUMENTS

| | | | | |
|---|---|---|---|---|
| 5,375,652 A | * | 12/1994 | Matsunaga et al. | 165/80.3 |
| 5,535,816 A | * | 7/1996 | Ishida | 165/80.3 |
| 5,793,611 A | * | 8/1998 | Nakazato et al. | 165/104.33 |
| 5,896,917 A | * | 4/1999 | Lemont et al. | 165/80.3 |
| 6,041,850 A | * | 3/2000 | Esser et al. | 165/104.33 |
| 6,084,772 A | * | 7/2000 | Pell et al. | 165/104.33 |
| 6,137,682 A | * | 10/2000 | Ishimine et al. | 165/104.33 |
| 6,189,601 B1 | * | 2/2001 | Goodman et al. | 165/104.33 |
| 6,263,957 B1 | * | 7/2001 | Chen et al. | 165/104.33 |
| 6,394,175 B1 | * | 5/2002 | Chen et al. | 165/104.33 |
| 6,397,941 B1 | * | 6/2002 | McCullough | 165/185 |
| 6,542,364 B2 | * | 4/2003 | Lai et al. | 165/104.33 |
| 6,591,898 B1 | * | 7/2003 | Chu et al. | 165/104.33 |
| 6,625,021 B1 | * | 9/2003 | Lofland et al. | 165/104.33 |

FOREIGN PATENT DOCUMENTS

JP 3-96261 * 4/1991 ............ 165/104.33

* cited by examiner

Primary Examiner—A. Michael Chambers
(74) Attorney, Agent, or Firm—Wei Te Chung

(57) ABSTRACT

A heat dissipating apparatus (10) includes a heat pipe (20) and a heat sink (30). The heat sink is made by die-casting, and includes a chassis (32) and a plurality of fins (34) extending upwardly from the chassis. The heat pipe is U-shaped, and is embedded in the heat sink in intimate contact with the chassis and the fins. The heat pipe includes a first end (12) and a second end (14). The first end is partially embedded in the chassis of the heat sink, for transfer of heat from the chassis to the first end by way of vaporization of working medium in the heat pipe. The second end is embedded in upper portions of the fins, for transfer of heat from the heat pipe to the fins by way of condensation of the vaporized working medium.

6 Claims, 4 Drawing Sheets

HEAT DISSIPATING APPARATUS AND METHOD FOR PRODUCING SAME

BACKGROUND OF THE INVENTION

1. Field of the Invention

The present invention relates to heat dissipating apparatuses and methods for their production, and more particularly to a heat dissipating apparatus having a heat pipe integrally embedded in a heat sink.

2. Description of Related Art

A computer central processing unit (CPU) is the core administrator of electrical signals in most contemporary personal computers. Continued development of CPUs has enabled them to perform more and more functions. Heat generated by CPUs has increased commensurately. If excessive heat is generated, this can adversely affect the operational stability of the CPU and the computer. Measures must be taken to efficiently remove the heat from the CPU.

In the electronics industry, the heat pipe is a relatively recent innovation. The heat pipe utilizes a working material's phase changes to absorb heat and release heat. The heat pipe is a vacuum-tight vessel partially filled with the working material. The working material is typically water, alcohol or ammonia, and functions as a heat carrier medium. When the heat carrier medium in an evaporation area of the heat pipe is heated by heat generated from the CPU, the phase of the heat carrier medium changes from liquid to vapor. By such phase change, the heat carrier medium absorbs a certain amount of the heat. Then the vapor flows along the heat pipe to a condensation area thereof. The vapor condenses back to a liquid phase by giving up its latent heat of vaporization. Such heat is transferred to an adjoining heat dissipating means such as fins of a heat sink. The liquid flows back to the evaporation area by force of gravity. Internal wicking structures may be used to facilitate the flow of liquid back to the evaporation area by way of capillary action. At the evaporation area, the heat carrier medium then repeats the cycle of removing heat generated from the CPU.

A conventional heat-pipe radiator, as shown in Taiwan Patent No. 86212279, uses two parts of a heat dissipation means to clip a heat pipe device therebetween. Each said part forms several hooks engaging with the other part. The heat pipe is sandwiched between said two parts. Over time, the engagement between said parts progressively weakens. Contact between the heat pipe and said parts loosens, thus reducing the thermal contact area therebetween. This reduces the heat dissipation efficiency of said parts.

Taiwan Patent No. 88114649 discloses a method for producing a heat dissipating device. The heat dissipating device comprises two symmetric heat sinks and a heat pipe sandwiched therebetween. The heat sinks are made by die-casting, and the heat pipe is made separately. The heat sinks are then clipped around the heat pipe to each other with screws. Production of these separate parts and subsequent assembly thereof is unduly complicated, time-consuming and costly.

SUMMARY OF THE INVENTION

Accordingly, an object of the present invention is to provide a heat dissipating apparatus having a heat pipe integrally embedded in a heat sink for enhanced thermal conductivity.

Another object of the present invention is to provide a heat dissipating apparatus which is easily molded and easily manufactured.

A further object of the present invention is to provide a method for manufacturing a heat dissipating apparatus which integrally combines a heat pipe and a heat sink together.

In order to achieve the objects set out above, a heat dissipating apparatus of the present invention includes a heat pipe and a heat sink. The heat sink is made by die-casting, and includes a chassis and a plurality of fins extending upwardly from the chassis. The heat-pipe is U-shaped, and is embedded in the heat sink in intimate contact with the chassis and the fins. The heat pipe includes a first end and a second end. The first end is partially embedded in the chassis of the heat sink, for transfer of heat from the chassis to the first end by way of vaporization of working medium in the heat pipe. The second end is embedded in upper portions of the fins, for transfer of heat from the heat pipe to the fins by way of condensation of the vaporized working medium.

Other objects, advantages and novel features of the present invention will become more apparent from the following detailed description when taken in conjunction with the accompanying drawings, in which:

DETAILED DESCRIPTION OF THE INVENTION

Figure 1:
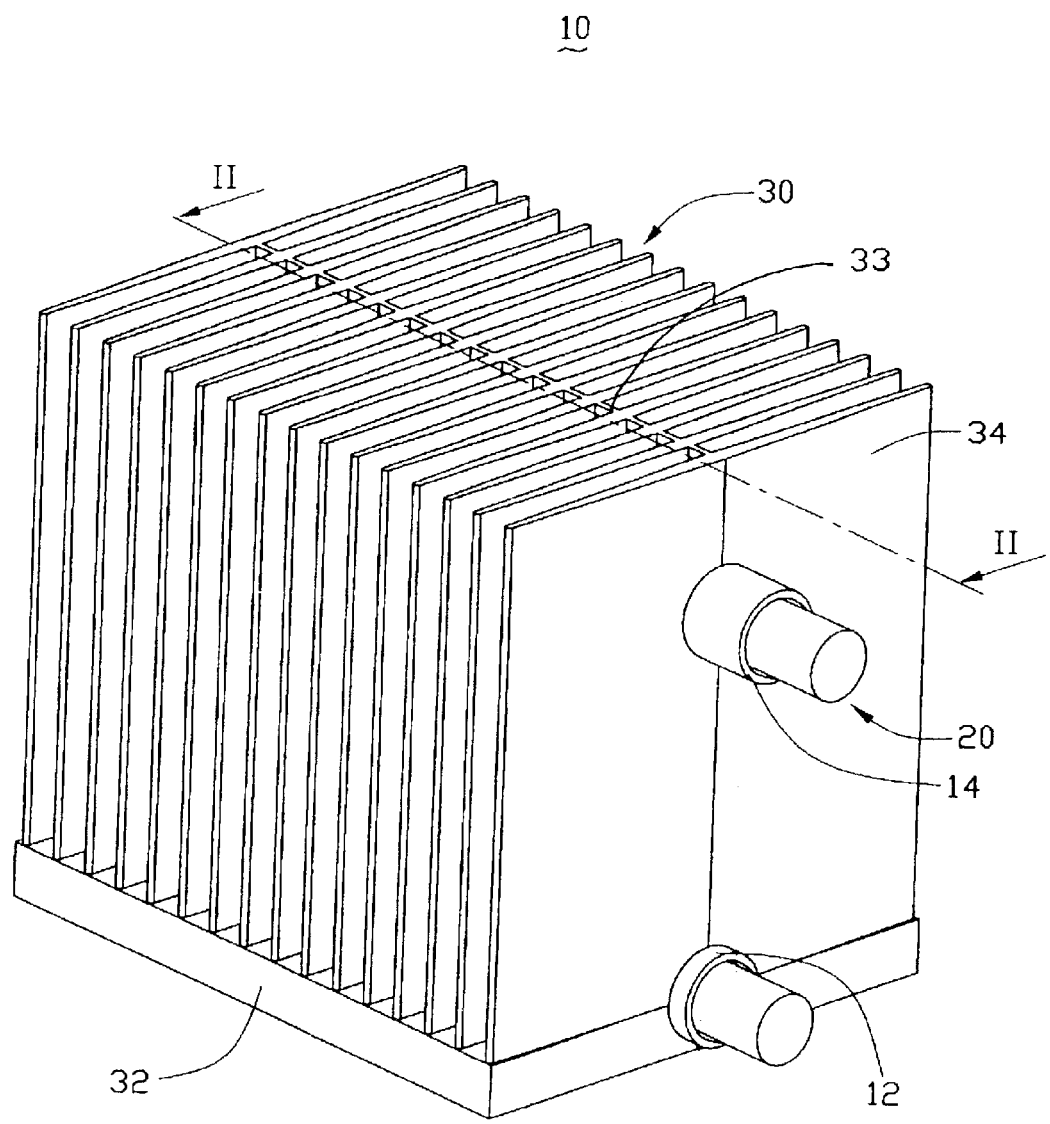
FIG. 1 is an isometric view of a heat dissipating apparatus in accordance with the present invention.

Reference will now be made to the drawing figures to describe the preferred embodiment of the present invention in detail.

Figure 2:
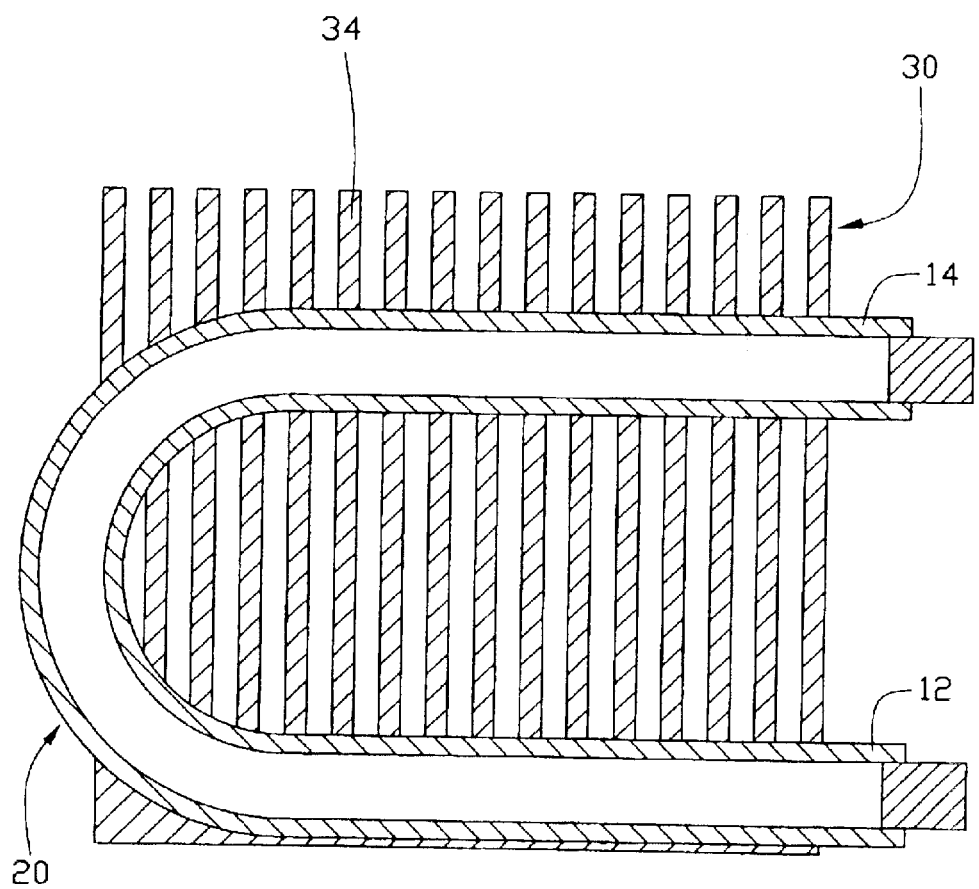
FIG. 2 is a cross-sectional view of FIG. 1, taken along line II—II of FIG. 1.

As shown in FIGS. 1 and 2, a heat dissipating apparatus 10 of the present invention includes a heat pipe 20 and a heat sink 30. The heat sink 30 is made by die-casting, and includes a chassis 32 and a plurality of parallel fins 34 extending upwardly from the chassis 32 with a cross bar 33 intercepting said fins and joining the fins 34 together. An upper hole (not labeled) is transversely defined through an upper portion of the plurality of fins 34. A lower hole (not labeled) is transversely defined through the chassis 32 and adjoining portions of the plurality of fins 34. The upper and lower holes are connected at one end of the heat dissipating apparatus 10 by an arch-shaped connecting hole (not labeled). The heat pipe 20 is U-shaped, and mounted in the combined upper, lower and connecting holes of the heat sink 30. The heat pipe 20 includes a lower first end 12 and an upper second end 14. The first end 12 is received in the lower hole of the heat sink 30. The second end 14 is received in the upper hole of the heat sink 30.

Figure 3:
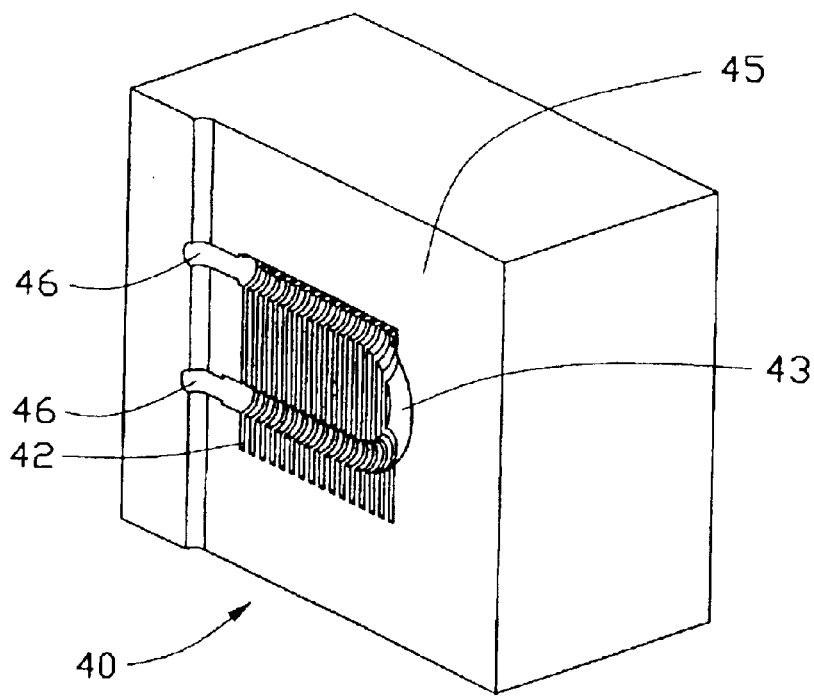
FIG. 3 is an isometric view of a stationary mold block used in a preferred method of the present invention for manufacturing a heat dissipating apparatus.
Figure 4:
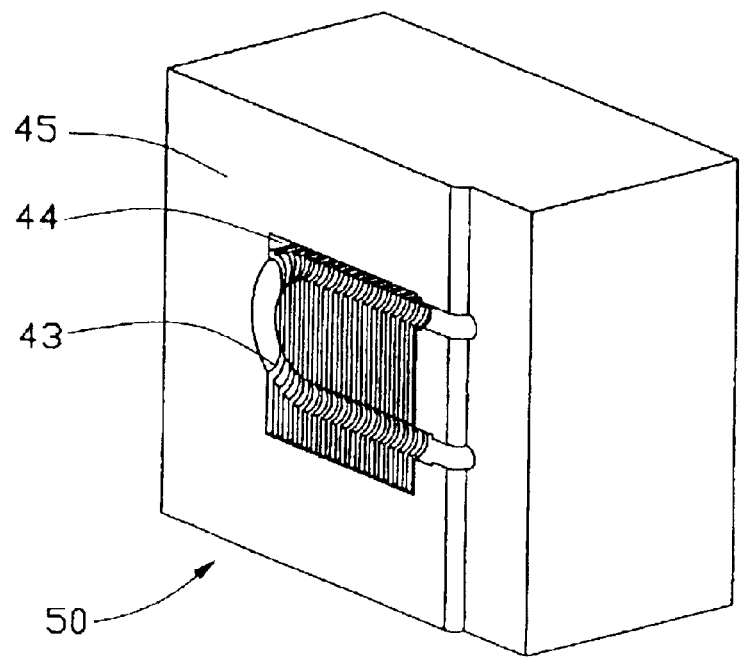
FIG. 4 is an isometric view of a movable mold block used in the preferred method of the present invention for manufacturing a heat dissipating apparatus.
Figure 5:
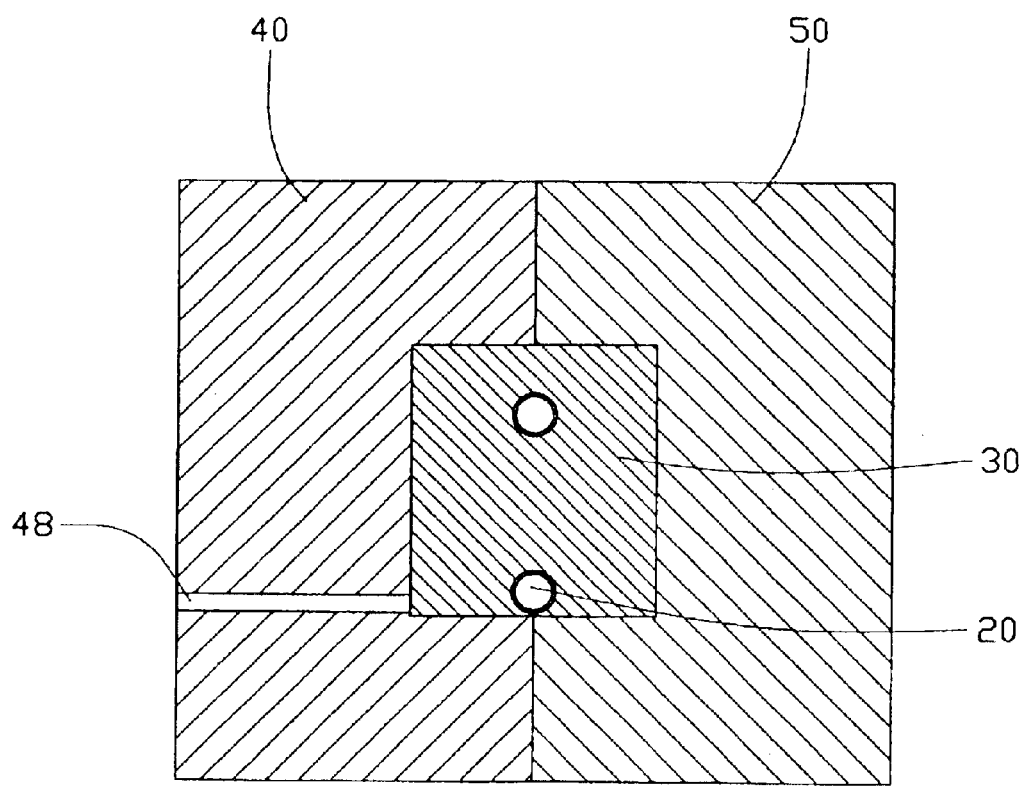
FIG. 5 is a schematic inverted side elevation cross-sectional view of the stationary and movable mold blocks of FIGS. 3 and 4 held together in a closed position during manufacturing of a heat dissipating apparatus according to the preferred method of the present invention.

FIGS. 3–5 show steps and apparatus relating to a method of the present invention for producing the heat dissipating apparatus 10. A stationary mold block 40 and a movable mold block 50 each have an interface 45. The interfaces 45 abut each other when the stationary and movable mold blocks 40, 50 are held together. A mold chamber (not labeled) is defined in each of the stationary and movable mold blocks 40, 50. The configurations of the two mold chambers are symmetrical. A plurality of parallel plates 42 is formed in each of the stationary and movable mold blocks 40, 50 at the respective mold chambers. When the heat dissipating apparatus 10 is cast, the plates 42 provide intervals between the fins 34 of the heat sink 30. Each mold chamber comprises a cavity 44 above the plates 42. When the heat dissipating apparatus 10 is cast, the cavities 44 cooperatively provide the chassis 32 of the heat sink 30. A U-shaped groove 43 is defined through the plates 42 at the interface 45 of each of the stationary and movable mold blocks 40, 50. A cross-section of each groove 43 is semi-circular. A pair of parallel slots 46 is defined in each of the stationary and movable blocks 40, 50 at the respective interfaces 45. Each slot 46 communicates with a respective end of the groove 43. The heat pipe 20 is received in the grooves 43 and the slots 46. An injection passage 48 is defined in the stationary mold block 40. One end of the injection passage 48 communicates with the cavity 44, and an opposite end of the injection passage 48 communicates with an outside of the stationary mold block 40.

When producing the heat dissipating apparatus 10, the heat pipe 20 is put into the groove 43 and slots 46 of the stationary mold block 40. The movable mold block 50 is attached on the stationary mold block 40, so that the stationary and movable mold blocks 40, 50 are in a tightly closed position. Molten metallic material is injected from a hot runner nozzle (not shown) into the injection passage 48, and is received in the mold chamber (not labeled). The mold chamber is completely filled with molten metallic material, which is then allowed to cool to a solid state. The movable mold block 50 is opened, and the solidified metallic material is removed from the stationary mold block 40. A surplus part of the solidified metallic material produced by the injection passage 48 is cut off. One end of the first and second ends 12, 14 of the heat pipe 20 is closed off. The heat pipe 20 is partially filled with water and capillary materials (not shown). Air is drawn out from the heat pipe 20, and then the other of the first and second ends 12, 14 is closed off. Thus, the heat dissipating apparatus 10 is produced.

In the present invention, the heat pipe 20 is mounted in the heat sink 30 in intimate contact with the chassis 32 and the fins 34. This enhances the heat dissipating capability of the heat dissipating apparatus 10. In operation, heat is conducted from the chassis 32 to the heat pipe 20 at the first end 12. Water in the first end 12 is vaporized, and travels to the second end 14 of the heat pipe 20. The vaporized water condenses, and heat is conducted to the fins 34. The condensed water returns to the first end 12 by force of gravity and capillary action.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating apparatus, comprising:
    a heat sink comprising a chassis and a plurality of fins extending from the chassis, at least one through hole being defined through the plurality of fins; and
    a heat pipe pre-embedded in the at leapt one through hole when the fins are made, and comprising a first end for conducting heat from the chassis and a second end for dissipating heat received from the first end, wherein
    the heat pipe directly touches the fins in the first and second through holes without intervening components interposed between the heat pipe and the heat sink, and
    wherein the heat pipe is generally U-shaped and embedded substantially transversely in the fins, and wherein the first and second ends of the heat pipe extend beyond the heat sink.

2. The heat dissipating apparatus as recited in claim 1, wherein the at least one through hole comprises a first through hole defined partly or wholly in the chassis and a second through hole defined in an upper portion of the fins, and wherein the first end of the heat pipe is arranged in the first through hole and the second end of the heat pipe is arranged in the second through hole.

3. A heat dissipating apparatus comprising:
    a heat sink including a plurality of fins arranged spatially parallel with one another; and
    a heat pipe extending through said fins in a built-in manner with said heat sink over-molded thereon,
    wherein the heat pipe is formed and pre-embedded before said fins are over-molded thereon, under a condition that a structural relation among said heat pipe and said heat sink does not allow said heat sink to be manufactured separately beforehand and assembled to the heat pipe later, and wherein
    said heat sink further includes a chassis on which the fins are seated, for engagement with a heat generating device and one end of the heat pipe engages the chassis.

4. The apparatus as recited in claim 3, wherein the other end of the heat pipe is far away from the chassis.

5. The apparatus as recited in claim 4, wherein said heat pipe is of a lying U-shape.

6. A heat dissipating apparatus comprising:
    a heat sink including a plurality of fins arranged spatially parallel with one another; and
    a heat pipe extending through said fins in a built-in manner with said heat sink over-molded thereon,
    wherein said heat sink further includes a cross bar intercepting the fins and joining the fins together,
    wherein the fins engage the heat pipe circumferentially while the cross bar engages the heat pipe axially.

\* \* \* \* \*